United States Patent
Herreid et al.

(10) Patent No.: US 10,881,040 B1
(45) Date of Patent: Dec. 29, 2020

(54) ADJUSTABLE MOBILE ELECTROSTATIC DISCHARGING CART

(71) Applicant: Kendall Howard, Chisago City, MN (US)

(72) Inventors: Kenneth Randall Herreid, North Oaks, MN (US); Max Diederich, Minneapolis, MN (US); Brent Sandstrom, Oakdale, MN (US)

(73) Assignee: Kendall Howard, Chisago City, MN (US)

( * ) Notice: Subject to any disclaimer, the term of this patent is extended or adjusted under 35 U.S.C. 154(b) by 0 days.

(21) Appl. No.: 16/535,061

(22) Filed: Aug. 7, 2019

(51) Int. Cl.
*H05F 1/00* (2006.01)
*H05K 13/00* (2006.01)
*B62B 5/00* (2006.01)
*B62B 3/02* (2006.01)

(52) U.S. Cl.
CPC .......... *H05K 13/0061* (2013.01); *B62B 3/02* (2013.01); *B62B 5/00* (2013.01); *B62B 2206/06* (2013.01)

(58) Field of Classification Search
CPC .................................. H05F 1/00; H05F 3/00
See application file for complete search history.

(56) References Cited

U.S. PATENT DOCUMENTS

| | | | | |
|---|---|---|---|---|
| 2,753,491 | A * | 7/1956 | Legge | H05F 3/02 361/219 |
| 4,605,988 | A * | 8/1986 | Nienhuis | H05F 3/02 174/51 |
| 4,720,048 | A * | 1/1988 | Maroney | B62B 3/00 280/47.34 |
| 6,327,131 | B1 * | 12/2001 | Thomas | H05F 3/02 361/212 |
| 7,697,259 | B2 * | 4/2010 | Chiou | H01L 21/67359 361/231 |
| 2003/0107195 | A1 * | 6/2003 | Zambanini | B60B 33/0039 280/47.34 |

* cited by examiner

*Primary Examiner* — John D Walters
*Assistant Examiner* — James J Triggs
(74) *Attorney, Agent, or Firm* — Martin IP Pty Ltd

(57) ABSTRACT

An adjustable mobile electrostatic discharge cart that includes at least one extendable support connected to at least one level. One each level, a conductive plate is located on each level and covered by a conductive mat. The plate of each level is connected to a electrostatic ground connected in parallel, so that the connection to the electrostatic ground is continuous as the cart moves and the support extends. At least one caster for mobility is in contact with the floor and conductively connected to the electrostatic ground.

20 Claims, 5 Drawing Sheets

ADJUSTABLE MOBILE ELECTROSTATIC DISCHARGING CART

BACKGROUND

In the area of electronics, many manufacturers and producers rely on electro static grounds to discharge any charge build up around their electrical components that can be damaged or destroyed when the static charge discharges. Workers may use workbenches to put their tools and components. The workbenches may move around the station or building to transport the components. These workbenches, however, are not ergonomic for the workers. Mobility also causes problems with grounding the electrostatic charge because a constant ground is difficult to achieve, and it is difficult to remain charge neutral. The ability to work on and handle sensitive electronics without static electricity arcing and damaging components continues to persist as a problem with workstations.

Further, in the field of manufacturing of electrical equipment, electrostatic discharge ("ESD") is harmful to components. There are various forms of ESD, and one particular form is the spark, which occurs when a heavy electric field creates an ionized conductive channel in the air. The result of this sudden discharge can cause minor discomfort to people, severe damage to electronic equipment, as well as fires and explosions if the air contains combustible gases or particles. Many ESD events occur without a visible or audible spark and workers would not even realize that ESD is occurring. A person carrying a relatively small electric charge may not feel a discharge that is sufficient to damage sensitive electronic components. Some devices may be damaged by discharges as small as 30 V. These invisible forms of ESD can cause outright device failures, or less obvious forms of degradation that may affect the long-term reliability and performance of electronic devices.

Many electronic components, especially microchips, can be damaged by ESD. Sensitive components need to be protected during and after manufacture, during shipping and device assembly, and in the finished device. Grounding is especially important for effective ESD control.

In manufacturing, prevention of ESD is based on an Electrostatic Discharge Protected Area (EPA) and may include a small workstation or a large manufacturing area. The main principle of an EPA is that there are no highly-charging materials in the vicinity of ESD sensitive electronics, all conductive and dissipative materials are grounded, workers are grounded, and charge build-up on ESD sensitive electronics is prevented. The problem is that these workstations are stationary, and the many components need to be moved to none grounded equipment, which may not be grounded and damage from ESD may then occur when components and products move off of or out of the grounded EPA. ESD is also important in medicine as electrostatic discharge may harm medical equipment and impair medical treatment and monitoring.

The details of one or more examples of the disclosure are set forth in the accompanying drawings and the description below. Other features, objects, and advantages will be apparent from the description and drawings, and from the claims.

SUMMARY OF THE INVENTION

This disclosure enhances an electrostatically grounded cart by making the cart mobile while maintaining ground connection with a common ground, so that every surface of the cart is grounded. In one example, an adjustable mobile cart, including at least one extendable support, at least one level, wherein the at least one level attaches to the at least one extendable support. The cart may also include a plate located on each of the respective level of the least one level, an electrostatic ground connected in parallel to each of the at least one level, so that the connection to the electrostatic ground is continuous as the cart moves and the support extends, and at least one caster for mobility in contact with the floor and conductively connected to the electrostatic ground. The adjustable mobile cart may also have at least one level with a ground plate, and each ground plate on each of the at least one level is connected to the electrostatic ground. The adjustable mobile cart in claim 1, wherein the at least one extendable support is an actuator with an inner part that through a telescoping device, extends out from a larger outer part that houses wires. The adjustable mobile cart in claim 1, wherein the one level adjusts the height of the mobile cart using at least one linear actuator and maintaining continuous ground as the linear actuator raises the at least one level and the cart is in motion.

The adjustable mobile cart in claim 1, wherein the cart moves with electrostatic grounded wheels, which are part of casters that facilitate electrostatic discharge, and connect to the adjustable mobile cart. The electrostatic ground may be located on the at least one level and is in conductive connection to at least one caster, further wherein the conductively connected at least one caster is further connected to an earth ground, which is different from the electrostatic ground. The adjustable mobile cart may have at least one level that is at least one of a shelf, drawer, bin, rack, monitor, or peg board.

The adjustable mobile cart may further include more than one plate, wherein the electrostatic ground is connected in parallel to each plate located on each of the at least one level and the plate is conductive to facilitate electrostatic charge from objects on the plate to the electrostatic ground. The adjustable mobile cart may be adjustable using a motor, air, hydro, mechanical, actuator, or spring means. Each of the at least one levels of the cart may include a mat, which is made from either nonconductive material or conductive ESD grounding material, wherein the conductive grounding material helps to facilitate electrostatic charge grounding when in contact with the mat. The electrostatic ground may connect to the plate on each of the at least one lower shelf, so that more than one plate connects in parallel, and the electrostatic ground also connects to the caster, so that the connections are continuous to maintain electrostatic discharging.

The adjustable mobile cart of claim 1, further includes a power source for powering the at least one extendable support for extending and retracting the extendable support. The adjustable mobile cart of claim 1, further including a control for automated height adjustment, including both raising and lowering of at least one of the at least one level. The adjustable mobile cart may contain a battery compartment that is may be insulated to prevent adverse effect on electrostatic discharge performance, and may further include a connection to a power source, where the connection is for at least one of a battery or a remote power source, and the power source may power electrical equipment on the adjustable mobile cart. The adjustable mobile cart may include a conductive mat covering the upper surface of each of the respective at least one level, wherein at least the plate is covered.

A system for electrostatically grounding a mobile cart, including at least one extendable support, at least one level, wherein the at least one level attaches to the at least one extendable support, a plate located on each of the respective level of the least one level. The system may include at least one mat covering the at least the plate located on each of the at least one level, wherein the mat is at least partially formed with conductive material for facilitating grounding of electrostatic charge when the user or components are near the mat. The system may also have an electrostatic ground connected in parallel to each of the at least one level, so that the connection to the electrostatic ground is continuous as the cart moves and the support extends. The at least one caster for mobility in contact with the floor and conductively connected to the electrostatic ground. The system may include a control, either remotely or locally, for controlling at least one of expansion and retraction of the actuators, power supplied to the actuators or to the adjustable mobile cart, or movement and direction of the cart.

A method for discharging electrostatic charge on an adjustable mobile cart, including providing at least one extendable support, providing at least one level, wherein at least one level attaches to at least one extendable support, and grounding each of at least one level using a plate located on each respective level. The method may further include grounding electrostatic discharge using at least one mat covering at least the plate located on each of at least one level, wherein the mat is at least partially formed with conductive material for facilitating grounding of electrostatic charge when the user or components are near the mat, and connecting an electrostatic ground in parallel to each of at least one level, so that the connection to the electrostatic ground is continuous as the cart moves and the support extends. The method may further include facilitating grounding and mobility using at least one caster in contact with the floor and conductively connected to the electrostatic ground. In some examples, the method may further include the step of providing an actuator that is powered by a power supply for automatic adjustment of height of the adjustable mobile cart.

DETAILED DESCRIPTION

Figure 1:
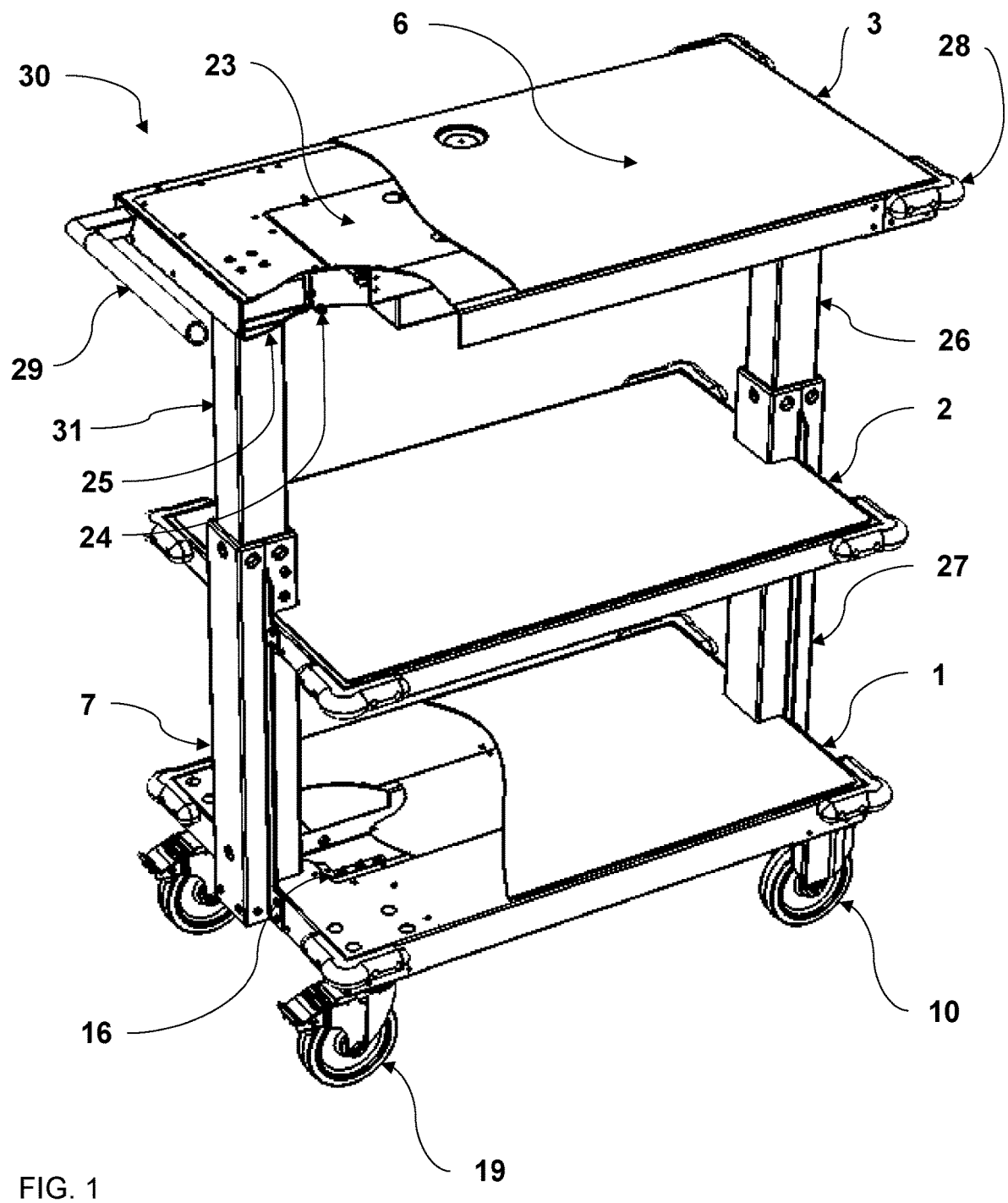
FIG. 1 is an example illustration of a mobile cart that may enhance electrostatic discharge workstations, in accordance with one or more techniques of the present disclosure.

In general, this disclosure describes enhancing carts that have electrostatic charge build-up, overcoming the challenges by providing a charge neutral workstation that is mobile for transporting sensitive electronic components throughout a facility and is adjustable for agronomical design, so that the mobile work station is constantly charge neutral and harmful electrostatic charge is dissipated. Uses may include clean rooms, medical rooms, computer components handling, manufacturing, industrial and other electrostatic discharge ("ESD") sensitive areas.

In one example, the mobile cart maintains constant ESD ground to the mobile workstation to maintain a constant neutral charge. The cart, or workstation, is mobile as well as ergonomically adjusts the height while maintaining connection and protecting the conductive component that may create the neutral charge through a ground connection, so nothing on the cart is caught or damaged so that the connection to ground may be maintained. Such grounds may include a common ground, controlled ground, earth ground, or virtual ground. In some examples, the connection may include wires connected in parallel from each of the levels that each respectively connect through a post to a common ground, which is a controlled ground. An earth ground may also be connected from a caster to the floor for completing the circuit. In this way, the connection with ground may be continuous, even as the height of at least one level raises or lowers. In some examples, the wires are within casing or have spring like characteristics, so that extra wires do not hang out of the cart. In another example, the wires are flexible to bend within a casing and then extend out as the support actuator raises the level(s) of the cart. There may be one or more actuators present on both sides and for each level of the cart. Connection to this type of ground may allow the cart to be used on every type of floor and may not require a floor made out of special material that discharges electric static charge.

In one example, the common ground may be built independently onto the cart. The ground may incorporate a circuit to ground any charge. In one example, the circuit may take the full electrical discharge (the ESD event) instantaneously, and that instantaneous discharge, which is what may damage components on the cart. The circuit may have different configurations. In one example, a 1-megohm resistor is in series with a conductive cart connected wire, or conductive material, causing the charge to bleed off over a few milliseconds and this reduces the shock to the grounding circuit. The electrostatic charge may bleed off or decay, so that the electrostatic charge becomes closer or at a neutral charge and sudden dissipation is no longer harmful to components. Other circuit configurations may include resistance of ohms rating of 104 to 109 for resistance for discharging electricity.

In this example, the cart may be mobile. Mobility may be through different means, but for the purpose of this unlimiting example, the cart may include wheels that roll on the ground. In one example, an ESD caster may house or connect to the wheel in a rotatable connection or mounting of the wheel and the caster. The connection may incorporate into the design wheel casing, or wheel mounts, for mobility so that conductive ground connections are not exposed and protected from easily becoming disconnected, which would disconnect the ground connection. The casters in this example may be connected to the ground and may also help maintain a neutral charge by discharging and electrostatic build-up. The caster may conduct the current through the surface(s) via hardwire to a common ground on the cart (possible off the cart with design cart) maintaining electrical continuity. The ground may maintain connection with every level of the cart. The casters may swivel so that the cart may turn in different directions. In some examples, all wheels have swivels, or a few or none may swivel rotatably for directional change. In some examples, the caster may include breaks or locks that may prevent the wheels from turning, rotating, spinning, moving, or lock in place. Again, these may be on one or more wheels, or no wheels. The number of wheels may be any number for creating stability of the cart. In this example, the cart may have 3-5 wheels, but any number is possible depending on the size and design of the cart. The wheels are made of an impact absorbing material, such as rubber, plastic, wood, poly-material, etc. In some examples, the wheels are made of conductive materials. In this example, conductive wheels may be part of the caster that connects to the ground, establishing an earth ground connection to complete the circuit so electrostatic discharge occurs. At least one of the wheels may maintain an earth ground connection with a caster connected to the ground circuit via constant connection such as a wire. In this way, any type of floor may be used for earth grounding and a special floor is not required for electrostatic discharge.

The wheels maintain contact with the ground for stability and to hold the cart upright. In this example, the wheels do not have to roll on special conductive floor material to dissipate any electrostatic charge but may be used on any type of floor surface. Wheels are used in this example, however, the disclosure may not be limited to wheels for mobility and other mobility may be added, such as tracks, rollers, levitation, and other types of techniques for moving the cart are also possible and within the scope of this disclosure.

In one example, a conductive plate may incorporate into at least one surface. However, the conductive plate may be any form or shape, such as a strip, line, rod, rail, bracket, etc., and for none limiting purposes of this disclosure is a plate shape. For example, the mobile cart may include at least one level, such as three levels, but any number of surfaces is possible. The conductive plate may be connected to all supports of the cart. In one example, every surface may incorporate a conductive plate, and in other examples, there may be none or at least one plate incorporated on the mobile cart.

In another example, the cart may have adjustable height. For example, the adjustment may be due to the ability to adjust the extension of a support. For example, the supports may be connected to at least one level and extending them may distance between at least one level from supports on the cart may have adjustable height by using actuators. In other examples, the supports may be mechanically adjustable to extend the length of the support. Other types are also possible, such as motor, mechanical, air lift, hydro, or spiral actuator. In the example of the actuator, the height adjust may be an electrical actuator that is powered and electrically extends out the supports. There may be at least one support that connects to each level. When the actuator activates, the parts may automatically extend out. For example, the support may include parts of different widths that telescope out from one another, so that the smaller width parts fit into a larger width part of the actuator. To raise the level, the smaller part may extend out of the larger part and raise the level. In this example, the level may connect to any of the parts of the support, such as the largest width support part may attach to the lower level, the upper level may attach to the smaller part inside the larger part, so when the actuator automatically raises the smaller part out, then the upper level may raise with the smaller part. The actuator may be controlled by a control panel, so that the user may be able to adjust the height as needed when work is being done or to lover the height for storage. The control panel may be on the side of the cart or a remote control.

The cart may be powered by a power source. In one example, the power source may be batteries. The batteries may be incorporated into one of the levels of the cart. Batteries may be used to power the actuator, providing movement, either vertically or horizontally. Batteries may also power other items on the cart, such as a monitor or other incorporated item. In one example, the batteries may incorporate into the top level, so that charging and changing the batteries is ergonomic without unnecessarily stressing the body, but another placement is possible. In another example, there may be a receptacle to receive a power cord and connect the batteries to a power source for charging. The batteries in the top level may be covered or concealed by a cover. In some examples, the batteries may be covered by a metal plate, such as the conductive metal plate. The battery is isolated from the ESD ground. The battery source may include one or more batteries. The batteries may be mounted to one of the parts of the cart, so the cart is powered without wires. Wireless electrical transfer may also be possible as wireless powering techniques improve. In the example of batteries on the cart, the batteries may be mounted to a part of the cart, such as the support or a level. The batteries may be mounted to the top level for ease in charging and may be mounted under, near, or on the level. In the example of the batteries on the top level, the batteries may be placed in a compartment on top, so that they do not interfere with other parts or components on the cart and the workspace created on the top level. In other examples, the cart may be powered by a plug-in power source or a wireless power supply.

The cart may include a rubber mat to be placed on the top level to protect the top level and the components from being scratched or harmed by moving the components. In some examples, the mobile cart may be a workstation for larger heavier components, or a means of transport, and the larger components are moved on and off the cart. The rubber mat in these examples may prevent damage to the components. The mat may be made out of different types of materials, such as foam, poly materials, rubber, styrene products, silicone, etc., combination of materials, or any other material that acts as a bumper to protect the components. In this example, the mat may be made from conductive materials or a mix of materials that include conductive materials, or chemicals that are conductive. In this way, the mat may be the start or first interface between a component or a user of the cart and start discharging or dissipating the electrostatic charge into the ESD system of the cart. Thus, the conductive material used in the mat may help to begin this process. When is object is on the mat or charge build up, the mat conducts the charge to the next component that that it is conductively connected to (or near) in a connection to ground. The mat may be attached to the level of the cart, any level of the cart, by adhesive, clip, snap, etc. to help keep it in place on the level or the mat may be separate to easily remove the mat from the cart. In some examples, upper surface of the upper (top) level may include a lip (raised line extending from the upper surface) to hold the mat in place and prevent the mat from slipping off the cart.

Other protective features may also be added, such as bumpers and safety equipment, to prevent damage to the cart and the area around where the cart is located. Bumpers may be on the sides of the cart to protect the levels to add space between the cart and any object that the cart may contact. Bumpers are needed when the cart is moving, so damage to the cart and other objects is reduced. The bumpers may be made of solid impact absorbing material or may mechanically absorb the force of impact. Raised sides may also be added to the levels so that components do not slide off the surface. This raised side may be a raised line or portion of the top surface, such as near the edge, of the level, so that components places on the surface of the level will likely stop when the component slides/slips and contact the raised portion. Other safety features to protect the cart, the components on the cart, and the area around the cart are within the scope of this disclosure.

Enhancing workstations with ESD protection is an advantage in the industry, because mobile carts can be used as work space or move heavy equipment. The enhanced ESD reduces the risk to components, particularly electrical components, and integrally incorporates the ESD ground connections to ground. Without this ESD system the discharge would be more violent and/or destructive to electronics and/or integrated circuits. This cart provides a safe discharge or decay between of electrostatic charge of the workstation and between two electrically charged items. The ergonomically adjustable height may also enhance the usability as it allows different levels to be placed at either the operators (the user's) height or the height of another workstation in the area that equipment may be transferred to or from. Without this ESD system the discharge would be more violent and/or destructive to electronics and/or integrated circuits.

FIG. 1 is an example illustration of a mobile cart 30 that may enhance electrostatic discharge workstations. In this example, FIG. 1 shows the mobile cart 30 having three levels, including an upper shelf 3, a middle shelf 2, and a lower shelf 3. In this example the levels 1-3 are shelves, but other items are possible, such as a drawer, bin, monitor, etc. Also, in this example, cart 30 may include four wheels 9-10 located under the four corners of the rectangular shaped lower shelf 1, but a square, trapezoidal, circular, oval, etc. shape is also possible and cart 30 is not limited to a rectangular shape. Casters 9-10 may include wheels 9-10 and the mounting and attach to cart 30. Caster 30 may be a swivel caster 9 that turns the cart or a fixed caster 10. In one example, swivel caster 9 may be conductive and made of conductive material, such as wires connected to the housing of swivel caster 9. In another example, fixed caster 10 may include nonconductive material, such as wires do not connect to the caster housing, making the caster nonconductive and not grounded. Lower shelf 1 may connect to at least one post (27 or 7). In the example of FIG. 1, at least one of the wheels may be connected to ground.

The cart may include at least 3 wheels for stability. FIG. 1 illustrates an example of 4 wheels with caster, including the wheel and the wheel mounting bracket. In this example, at least 2 of the casters may be conductive to complete the ESD RTG. In another example, cart 30 may include 3 casters on the ground, and one of the three may be an ESD caster. In order for this cart to provide ESD protection at least one of the ESD casters must be in contact with an earth grounded floor and one must be connected to common ground 16. Casters 19, 10 may be part of the ESD conductive system. Without the ESD casters, the earth ground circuit may not be established. Similar systems might use a drag chain (this is for static discharge only and not ESD protection) or physically wiring to a controlled ESD grounding point.

In the example of FIG. 1, two posts 27, 7 may be connected to lower shelf 1 and located opposite sides from one another, such as first post 7 and second post 8. Lower shelf 1 and middle shelf 2 may connect to first 7 and second post 8. First and second posts have a width, so that an inner post that has a smaller width than the outer post may fit inside and slide out of the outer post, and thus, extend the size of the post, including outer post 27 and inner post 26. The inner post 26 and outer post 27 may extend with a telescoping action, such that inner post 26 may fit within outer post 27, which as a bigger width, and slide from within outer post 27 outward from the side of outer post 27. In the example where lower shelf land middle shelf 2 are attached to either the first post (of outer post 7) or second post (of outer post 27), or both, on the outer side of the outer post, then the shelves may be fixed in place. When post 27 is extended such that inner post 26 is outside of outer post 27 of the first post and inner post 31 is outside of outer post 7 of the second post, then upper shelf 3 of cart 30 may be high. When inner post 26 may retract such that inner post 26 moves inside of outer post 27 of the first post and inner post 31 moves inside of outer post 7 of the second post, then the result may be a lower upper shelf 3 (illustrated in FIG. 5). The first and second posts may be adjustable using an actuator. Other possibilities to adjust the posts may include mechanical techniques, such as motor, mechanical, air lift, hydro, or spiral actuator.

The first and second post may attach, fixedly, to one of the shelves, such as middle shelf 2 or lower shelf 1, or both. In this example, when both attached to the outer post, then the middle and lower shelves are fix and cannot raise or lower in position. In another example, the middle shelf may attach to the inner post, and in this example, when the inner post raises then the middle shelf raises as a result of being fixed the raiseable inner post. In other examples, different arrangements may determine which shelf may raise and lower with the actuator.

In the example of FIG. 1, the actuator may be a linear actuator with a telescoping action that extends out and incorporates into cart 30 as the post that may raise and lower at least one shelf, depending on how each shelf connects to the actuator (posts 7 and 27). In another example, actuators may be in addition to posts 7 and 27. The actuator is powered by a power source. In the example of FIG. 1, the actuators may be powered by batteries, for example battery 13 of FIG. 4. The batteries may be powerful enough to power the actuators so that they extend out, causing at least upper level, or more specifically upper shelf 3, to raise upwards vertically away from the floor. There may be one or more batteries to power the actuator. In one example, 12V DC batteries may be used, but power is dependent on the size of cart 30 and may depend on the size of the actuators and the item incorporated at each level, for example powering a monitor on the top level (upper shelf 3) may require more battery power or an additional battery. Thus, larger batteries may be used.

Further in the example of FIG. 1, upper shelf 3 may incorporate conductive plate 23. Mat 6 may be conductive or none conductive. In instances where mat 6 is conductive, mat 6 may establish ground between upper shelf 2 to components on mat 6 (not illustrated in FIG. 1). Mat 6 may include a variety of materials that properly dissipate or discharge the electrostatic charge that may build up. For example, carbon, vinyl, metallics, metallic threads, mixed material with rubber, nitricell (or sponge), conductive rubber, silicone, elastomers, foam, polys, and other chemical or materials that conductively transfer or discharge electrostatic charge. Mat 6 may be on at least one level covering conductive plate 23 to provide ESD as well as "resistance to top" and "resistance to ground" protection. Each ESD mat 6 is the starting point of the ESD system for the respective level. Mat 6 may dissipate charge from workers that may have electrostatic charge build up when they touch the mat or components on mat 6. They provide the initial contact area where the user/object would establish a physical electrical circuit that would be passively discharged. Without the ESD mat, say an exposed metal surface or exposed conductive plate 23, the electrostatic discharge may be more violent, creating enough voltage to damage electronics and/ or produce a spark. Mat 6 may include material that is impact absorbent and may protect the components from damage and scratches.

Mat 6 of upper shelf 3 may lay on plate 23 forming an ESD connection to ground 16 through connection point 24. In this example, ESD connection point 24 may connect a wire or other conductive material through inner post 31 and outer post 7.

The wire (not illustrated in FIG. 1) may be a flexible or coil wire that expands as the actuator expands without disconnecting the ground connection to mat 6. With these types of wires, when the actuator retracts, the wire may retract so that the connection to ground does not interfere with the inner post 31 or the outer post 7, and inner post 31 retraction into outer post 7. Similarly, for outer post 27 and inner post 26. The ground connection, such as the wire, may continue the connection and connect to ground. In this example, the ground connection may connect mat 6 all the way to ground 16 for ESD, and each respective level may include mat 6 that connects similarly to ground 16 to prevent electrostatic buildup on each level, protecting components on every level of cart 30. In another variation of the example, the ESD connection point from the conductive plate 23 to upper shelf ESD connection point, which is a coiled cable (conductive wire) connects to post either to the top of the actuator (the top of inner post 31) or to the bottom of outer post 7, allowing the actuator post to expand without disconnecting or interfering with the wire. At this point, a wire then connects to ground 16. In another example, plate 23 and post connection point 25 may be with a wire that is not a coil cable, because this portion does not expand.

Through these connections, mat 6 may connected to ground 16. Through this example, all levels 1-3 are defined as Electrostatic Discharge (ESD) safe. The grounding connections may be similar for each level 1-3 and defined as resistance to ground (RTG) and resistance point to point (RTT). ESD Mat 6 (ESD Mat may be conductive and dissipative) provides a controlled ESD discharge. Each level may comply with design and test in accordance with to ANSI/ESD S4.1-2006. In this example, the ESD mat 6 to the ESD caster 19 (RTG) may be around $1 \times 10^6$ to $1 \times 10^9$ ohms. In another example, resistance RTT may be equal or greater than 1 megohm, for example in a point to point measurement taken from the ED mat only.

Mat 6 may be on the upper most working/storage area of each level. ESD Mat may be in contact with a conductive metal surface, which is called the ESD Main Plate (aka conductive plate 23), which may be on all three levels 1-3. ESD Main Plate 23 may be physically wired to an ESD Common Ground Plate, such as ground 16. The wiring may vary, such as a wire to a connection point at the post (actuator) on each level. For example, the wiring may continue or connect to a connection point, that may connect to a coil cable or other flexible wire. This disclosure may not limit the disclosure to any one type of wiring, and the wiring may be a single/multiple conductor. The wire gauge is not defined. In one example of a possible wiring type for cart 30, 16 GA, 600V Stranded wire, or other flexible wires are possible. The levels may all be connected to ESD Common Ground Plate, such as ground 16, or a plate connected to ground 16. The levels may be connected in series or parallel, but in this example, FIG. 1 illustrates an example of a parallel connection to ground 16. Ground 16 may be a common ground or controlled ground. Ground 16 may physically connect through wires to ESD Caster 19 (or 9). In this example, at least one ESD caster 19 connects to ground 16, allowing an earth ground to complete the circuit and dissipate electrostatic charge. ESD Caster may contain a conductive material may complete the ground from the ESD Mat to the earth grounded floor. Thus, any floor is possible and special floor material is not needed to conduct the flow. ESD ground 16 may be isolated to the mats only. All ESD mats may connect to the common ground in parallel. There may be some residual grounding.

Other optional features of cart 30 may include paint or any coating is nonconductive. A handle 29 may be insulated, but this is not required. Cart 30 may include a rubber bumper 28 that may be insulated, which is not required. Bumpers 28 may cover the corners to protect the cart, particularly at the corner, protecting cart 30 and the area around cart 30.

The disclosure focused on a mobile cart with wheels that incorporates stacked levels. The disclosure, however, may also incorporate expanding actuators that expand horizontally so the cart has wheels on what would have been the side. Horizontal expansion may allow bins of varying sizes or other items to be placed on the cart. This invention is not limited to vertical expansion and horizontal expansion is also within the scope of this disclosure.

Figure 2:
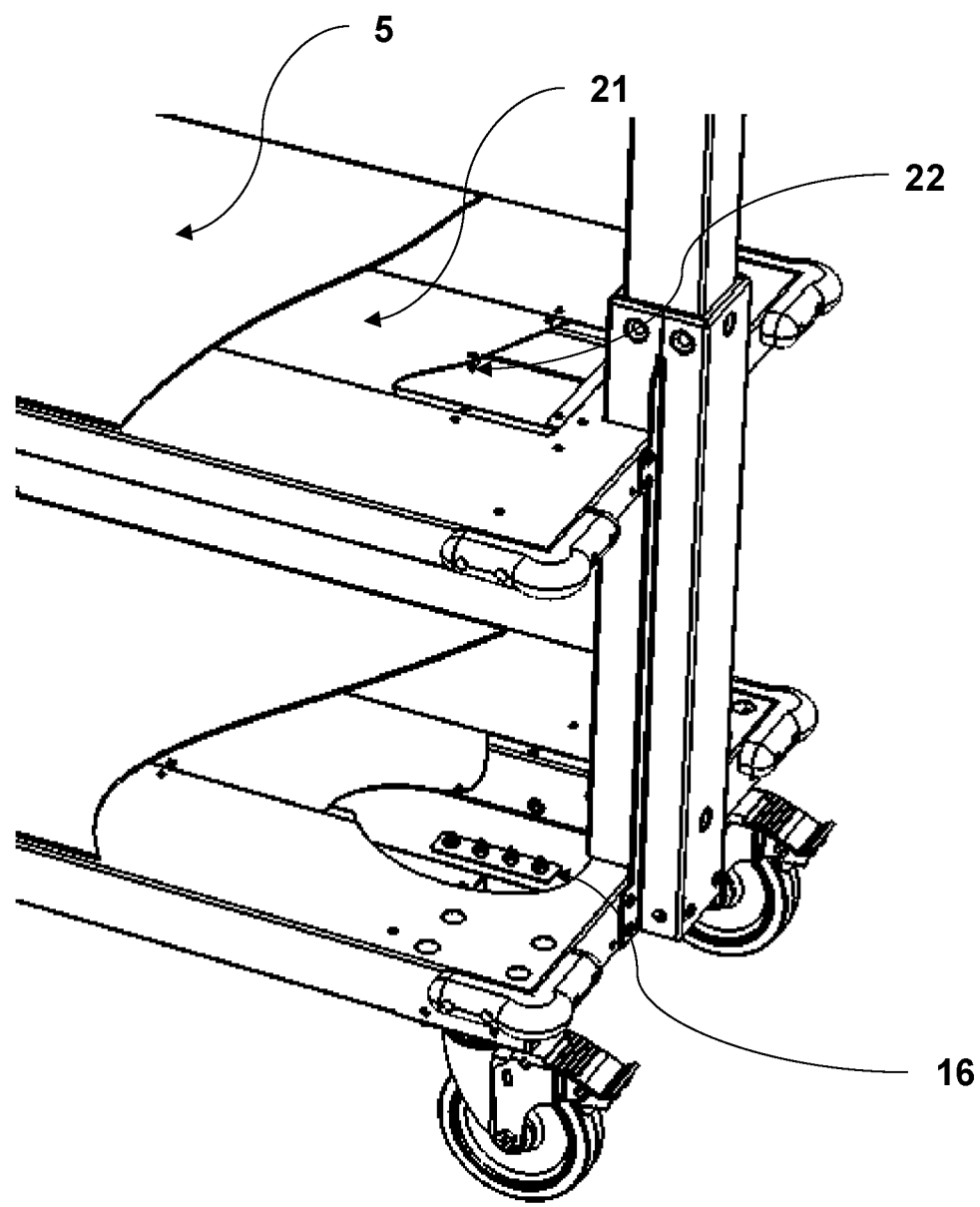
FIG. 2 is an example illustration of two lower levels of a mobile cart that may enhance electrostatic discharge workstations, in accordance with one or more techniques of the present disclosure.

FIG. 2 is an example illustration of two lower levels of a mobile cart that may enhance electrostatic discharge workstations. FIG. 2 may include an ESD middle mat 5, similar to mat 6 of upper shelf 3. Middle mat 5 may begin the ESD circuit for middle shelf 2 as it is the first interface with components and items on middle shelf 2. Middle mat 5 may contain conductive material to dissipate charge and the presence of middle mat 5 reduces the volatility, such as a spark, from charge build up and sudden transfer to another object. Middle mat 5 may cover middle shelf conduct plate 21, establishing ground to middle shelf ESD connection with middle mat 5. In FIG. 1, this point of connection or contact may be though a connection contacting to middle plate 21, such as the middle shelf ESD connection point, which may be a wire to common ground 16 connection, illustrated in FIG. 1 as a point of contact under the plate middle plate 21. In the example of FIG. 2, a wire connection (not illustrated) may run from middle shelf ESD connection point to ground 16. Ground 16 may include screws or fasteners to tighten the connection of the wire to the ground. In the example of FIG. 2, ground 16 may include four connectors that are pins or screws that can be tightened to hold wires to ground 16. Ground 16 may have four pins, so that each of the three levels (of FIG. 3) are each connected via wires, which are connected by the terminal pin to the ground. A fourth pin on ground 16 may connect a different wire to a caster for an earth ground connection. In this design, the four pins of ground 16 connect the levels in parallel.

Figure 3:
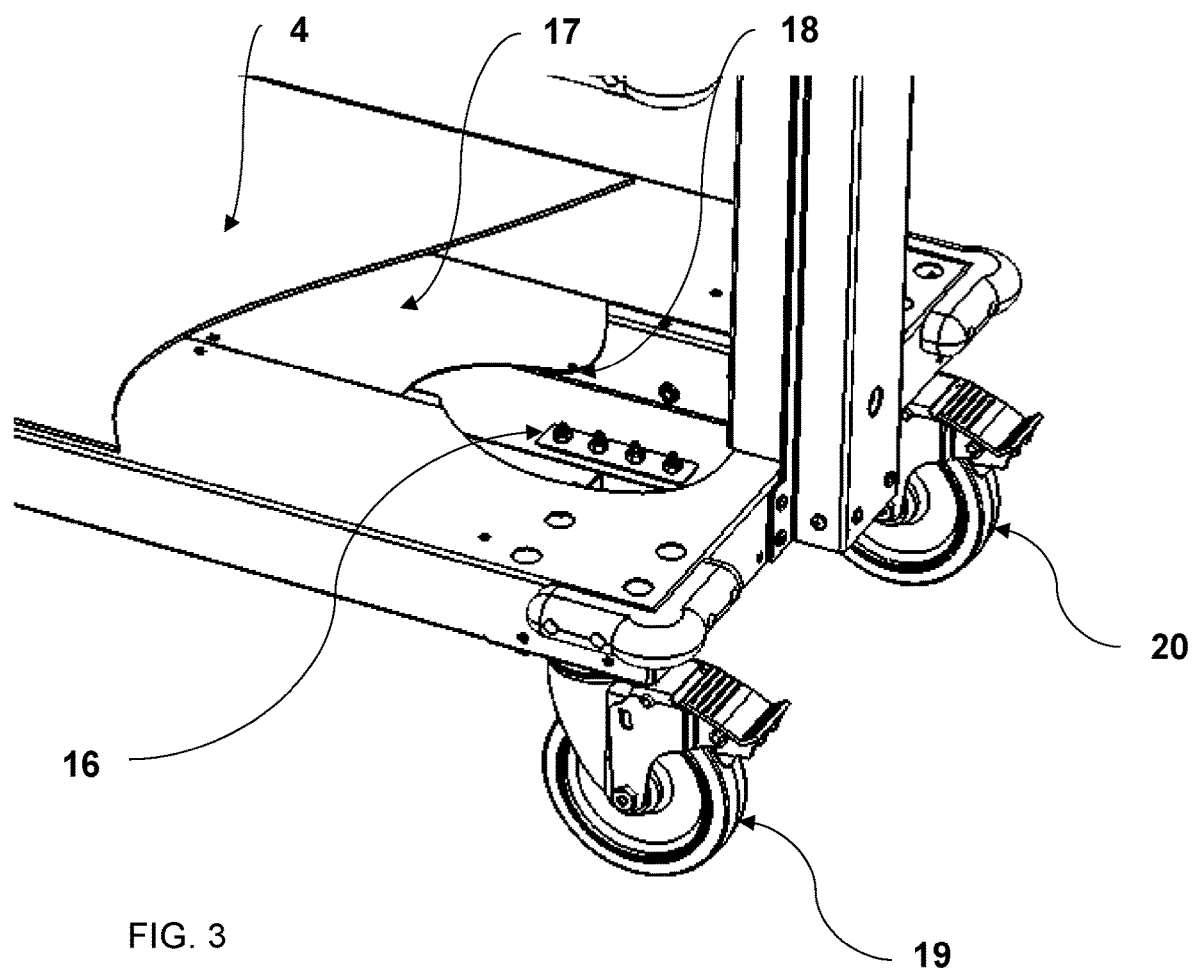
FIG. 3 is an example illustration of a lower level of a mobile cart that may enhance electrostatic discharge workstations, in accordance with one or more techniques of the present disclosure.

FIG. 3 is an example illustration of a lower level of a mobile cart that may enhance electrostatic discharge workstations. In this example, ESD lower mat 4 may be made of conductive material (similar to middle mat 5 and upper mat 6). Lower shelf 1 may also have a conductive plate 17 that may be flat, so that the upper surface of lower shelf 1 appears smooth when lower mat 4 is placed over conductive plate 17. These may be the first components of the connection to ground 16 in lower shelf's parallel connection. In one example, lower shelf ESD connection point 18 may connect to ground 16 via a wire (not illustrated). This point may be under lower plate 18 and in contact with lower plate 18. The wire connects to common ground 16, which may be the same ground that connects with middle shelf 2 and upper shelf 3. In FIG. 3, two wheels are illustrated within a caster, a first wheel 19 and a second wheel 20. The casters are wired to the common ground 16 to complete the circuit, for example with an earth ground, so charge dissipates.

Figure 4:
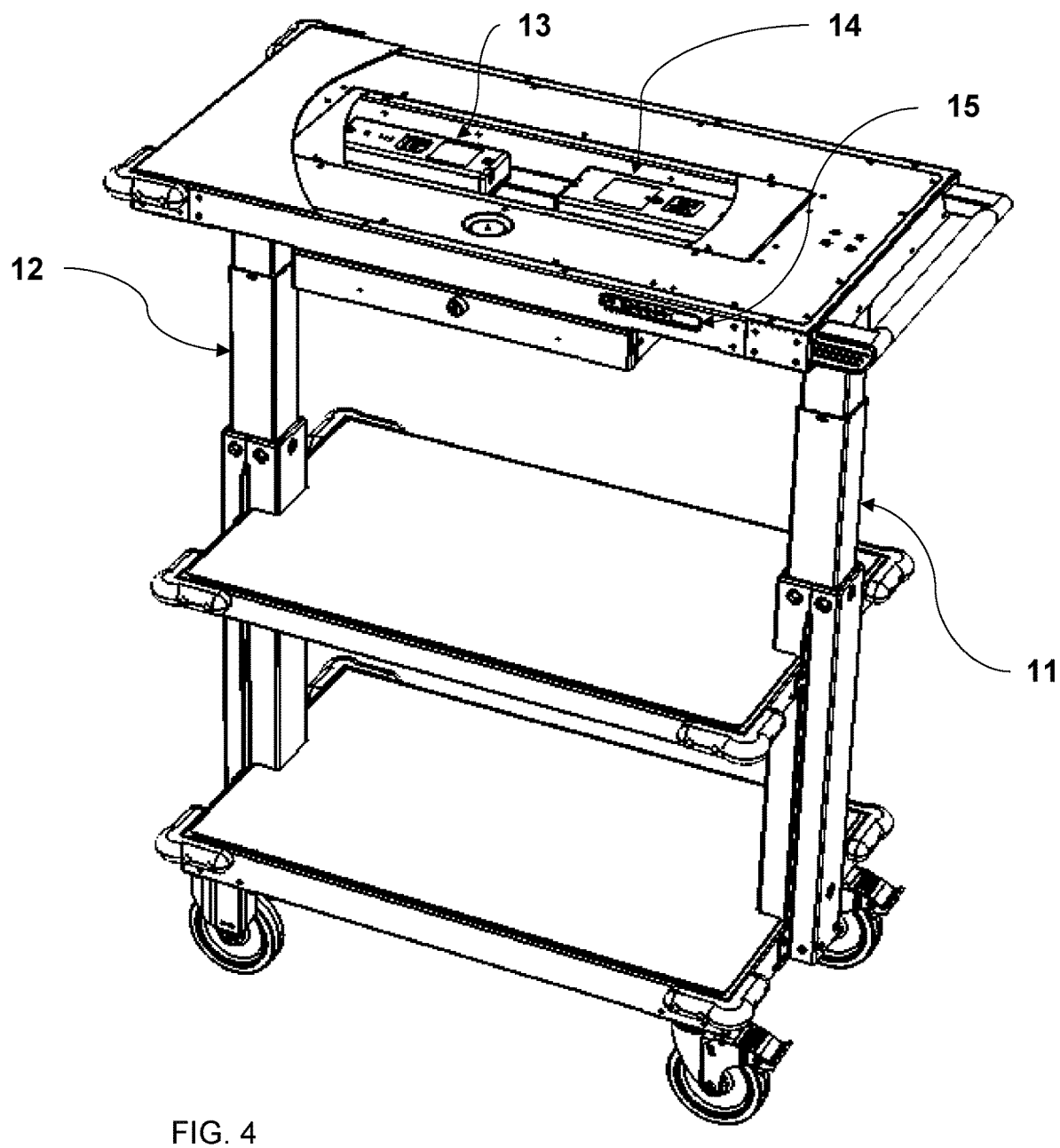
FIG. 4 is an example illustration of batteries powering an actuator of a mobile cart, in accordance with one or more techniques of the present disclosure.

FIG. 4 is an example illustration of batteries powering an actuator of a mobile cart. In this example, there are cut away diagrams (where portions are not illustrated) of the elements to show the layering and removing parts of a layer to expose the key design features. For example, upper level 3 may have upper mat 6 cut away in a portion to show upper conductive plate 23. The illustration may further cutaway upper conductive plate 23, to expose a first battery 13. Other batteries are possible depending on the power supply needed. These may be 12V DC batteries that power the actuators for raising and lowering the upper shelf and any other equipment that may need power. Battery 13 may power controller for the linear actuator pairs, first actuator 12 and second actuator 11. A user may use the operator control interface to cause the actuators to extend, which raises upper shelf 3, or cause the actuators to retract, which lowers upper shelf 3. FIG. 4 may also show that other components may be added to a level, such as drawer 32 added to upper shelf 3.

In another example, cart 30 may be remotely controlled, so that an operator can control the height and movement of cart 30 without touching cart 30. Remote control of cart 30 may integrate with control 15 or with another receiver unit not illustrated in FIG. 4.

Figure 5:
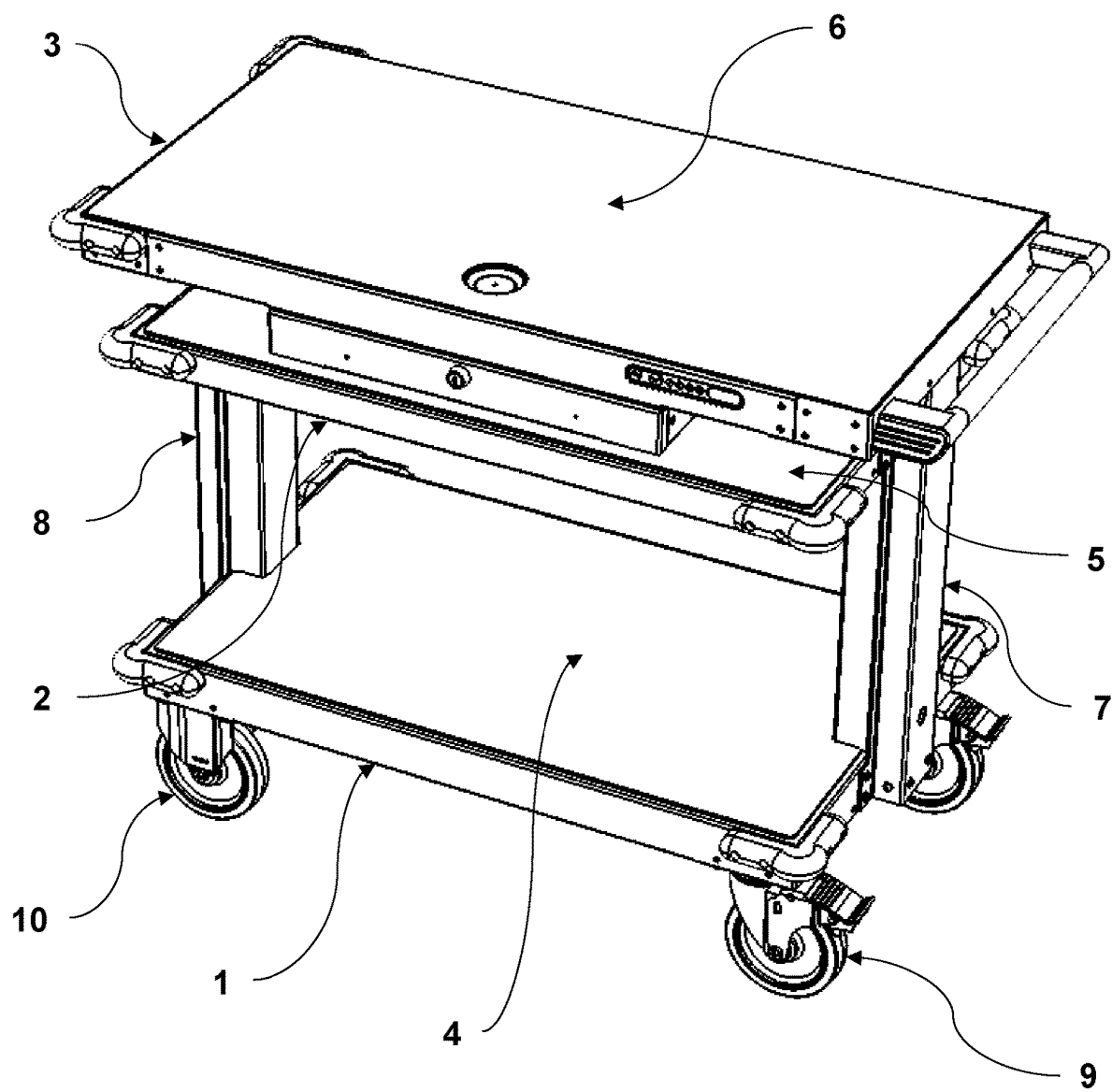
FIG. 5 is an example illustration of a mobile cart with a drawer and ESD mat, in accordance with one or more techniques of the present disclosure.

FIG. 5 is an example illustration of a mobile cart with a drawer and ESD mat. In this example, the actuator, first post 7 and second post 8, may retract, so that upper shelf 3 is close in position to middle shelf 2. Compared to FIG. 4, which upper shelf 3 may be higher than middle shelf 2, so that the distance between them is greater than in FIG. 5, and the distance may be based on how far the actuator extends the inner post out or up from the outer post. FIG. 5 also shows not cutaways in the diagram and may illustrate covering the batteries and conductive plates of each level.

What is claimed is:

1. An adjustable mobile cart, including:
   at least one extendable support;
   at least one level, wherein the at least one level attaches to the at least one extendable support;
   a plate located on each of the respective level of the least one level;
   an electrostatic ground connected in parallel to each of the at least one level, so that the connection to the electrostatic ground is continuous as the cart moves and the support extends; and
   at least one caster for mobility in contact with the floor and conductively connected to the electrostatic ground.

2. The adjustable mobile cart in claim 1, wherein the cart has at least one level with a ground plate, and each ground plate on each of the at least one level is connected to the electrostatic ground.

3. The adjustable mobile cart in claim 1, wherein the at least one extendable support is actuator with an inner part that telescoping extends out from a larger outer part that houses wires.

4. The adjustable mobile cart in claim 1, wherein the one level adjusts the height of the mobile cart using at least one linear actuator and maintaining continuous ground as the linear actuator raises the at least one level and the cart is in motion.

5. The adjustable mobile cart in claim 1, wherein the cart moves with electrostatic grounded wheels, which are part of casters that facilitate electrostatic discharge, and connect to the adjustable mobile cart.

6. The adjustable mobile cart of claim 1, wherein the electrostatic ground is located on the at least one level and is in conductive connection to at least one caster, further wherein the conductively connected at least one caster is further connected to an earth ground, which is different from the electrostatic ground.

7. The adjustable mobile cart of claim 1, wherein the at least one level is at least one of a shelf, drawer, bin, rack, monitor, or peg board.

8. The adjustable mobile cart of claim 1, further includes more than one plate, wherein the electrostatic ground is connected in parallel to each plate located on each of the at least one level and the plate is conductive to facilitate electrostatic charge from objects on the plate to the electrostatic ground.

9. The adjustable mobile cart of claim 1, wherein the cart is adjustable using a motor, air, hydro, mechanical, actuator, or spring means.

10. The adjustable mobile cart of claim 1, wherein each of the at least one levels of the cart includes a mat, which is made from either none conductive material or conductive ESD grounding material, wherein the conductive grounding material helps to facilitate electrostatic charge grounding when in contact with the mat.

11. The adjustable mobile cart of claim 1, wherein the electrostatic ground connects to the plate on each of the at least one lower shelf, so that more than one plate connects in parallel, and the electrostatic ground also connects to the caster, so that the connections are continuous to maintain electrostatic discharging.

12. The adjustable mobile cart of claim 1, further includes a power source for powering the at least one extendable support for extending and retracting the extendable support.

13. The adjustable mobile cart of claim 1, further including a control for automated height adjustment, including both raising and lowering of at least one of the at least one levels.

14. The adjustable mobile cart of claim 1, wherein the at least one level contains a battery compartment that is insulated to prevent adverse effect one electrostatic discharge performance.

15. The adjustable mobile cart of claim 1, further including a connection to a power source, where the connection is for at least one of a battery or a remote power source, and the power source may power electrical equipment on the adjustable mobile cart.

16. The adjustable mobile cart of claim 1, further including a conductive mat covering the upper surface of each of the respective at least one level, wherein at least the plate is covered.

17. A system for electrostatically grounding a mobile cart, including:
   at least one extendable support;
   at least one level, wherein the at least one level attaches to the at least one extendable support;
   a plate located on each of the respective level of the least one level;
   at least one mat covering the at least the plate located on each of the at least one level, wherein the mat is at least partially formed with conductive material for facilitating grounding of electrostatic charge when the user or components are near the mat;
   an electrostatic ground connected in parallel to each of the at least one level, so that the connection to the electrostatic ground is continuous as the cart moves and the support extends; and at least one caster for mobility in contact with the floor and conductively connected to the electrostatic ground.

18. The system of claim 17, further including:
a control, either remotely or locally, for controlling at least one of expansion and retraction of the actuators, power supplied to the actuators or to the adjustable mobile cart, or movement and direction of the cart.

19. A method for discharging electrostatic charge on an adjustable mobile cart, including:
providing at least one extendable support;
providing at least one level, wherein the at least one level attaches to the at least one extendable support;
grounding each of the at least one level using a plate located on each respective level;
grounding electrostatic discharge using at least one mat covering the at least the plate located on each of the at least one level, wherein the mat is at least partially formed with conductive material for facilitating grounding of electrostatic charge when the user or components are near the mat;
connecting an electrostatic ground in parallel to each of the at least one level, so that the connection to the electrostatic ground is continuous as the cart moves and the support extends; and
facilitating grounding and mobility using at least one caster in contact with the floor and conductively connected to the electrostatic ground.

20. The method of claim 19, further including the step of providing an actuator that is powered by a power supply for automatic adjustment of height of the adjustable mobile cart.

\* \* \* \* \*